(12) United States Patent
Mansour et al.

(10) Patent No.: US 10,432,206 B2
(45) Date of Patent: Oct. 1, 2019

(54) METHOD AND DEVICE FOR OPERATING AN ANALOG-TO-DIGITAL CONVERTER FOR CONVERTING A SIGNAL

(71) Applicant: Robert Bosch GmbH, Stuttgart (DE)

(72) Inventors: Ahmad Mansour, Weil der Stadt (DE); Stefan Leidich, Rutesheim (DE)

(73) Assignee: Robert Bosch GmbH, Stuttgart (DE)

( * ) Notice: Subject to any disclaimer, the term of this patent is extended or adjusted under 35 U.S.C. 154(b) by 0 days.

(21) Appl. No.: 16/007,132

(22) Filed: Jun. 13, 2018

(65) Prior Publication Data
US 2018/0367155 A1 Dec. 20, 2018

(30) Foreign Application Priority Data
Jun. 16, 2017 (DE) .................. 10 2017 210 103

(51) Int. Cl.
*H03M 1/00* (2006.01)
*H03M 1/12* (2006.01)

(52) U.S. Cl.
CPC .......... *H03M 1/002* (2013.01); *H03M 1/126* (2013.01)

(58) Field of Classification Search
CPC . H04L 27/0014; H04L 27/06; H04L 12/2801; H04L 25/00; H04L 25/02; H04L 27/2657; H04L 27/38; H04L 12/2838; H04L 12/2861; H04L 12/287; H04L 2012/2849; H04L 2027/0026; H04L 2027/0065; H04L 25/03006; H04L 25/03038; H04L 25/068; H04L 25/08; H04L 25/4902; H03M 3/422; H03M 1/12; H03M 3/436; H03M 3/332; H03M 3/396; H03M 3/358; H03M 1/0614; H03M 1/00

USPC ...... 455/266, 313, 188.1, 189.1, 323, 341.1, 455/314, 315, 318; 341/155, 139, 140

See application file for complete search history.

(56) References Cited

U.S. PATENT DOCUMENTS

| | | | | |
|---|---|---|---|---|
| 4,676,251 A * | 6/1987 | Bernatets | ............ | G01S 7/52025 600/442 |
| 4,894,566 A * | 1/1990 | Rush | ........................ | H03G 5/18 327/309 |
| 5,389,927 A * | 2/1995 | Turney | .................. | H03M 1/182 341/138 |
| 5,610,613 A * | 3/1997 | Hazard | .................... | H03M 1/12 342/115 |
| 5,937,020 A * | 8/1999 | Hase | ................. | G11B 20/10009 327/141 |
| 8,401,050 B1 * | 3/2013 | Fudge | .................. | H04B 1/0014 375/130 |

(Continued)

*Primary Examiner* — Linh V Nguyen
(74) *Attorney, Agent, or Firm* — Maginot, Moore & Beck LLP

(57) ABSTRACT

A method for operating an analog-to-digital converter to convert a signal includes calculating a signal parameter in a spectral sub-range of the signal to be converted. The spectral sub-range includes a frequency range of a potential sampling frequency range of the analog-to-digital converter, which does not include frequencies of at least one other sub-range of the sampling frequency range. The method further includes determining a sampling frequency of the analog-to-digital converter by using the signal parameter and operating the analog-to-digital converter using the determined sampling frequency.

19 Claims, 3 Drawing Sheets

(56) References Cited

U.S. PATENT DOCUMENTS

| | | | |
|---|---|---|---|
| 2011/0205092 A1* | 8/2011 | Kuroda | G01C 19/5776 341/118 |
| 2012/0183109 A1* | 7/2012 | Yang | H04B 1/1027 375/350 |
| 2013/0069812 A1* | 3/2013 | Waltari | H03M 1/0626 341/166 |
| 2014/0073279 A1* | 3/2014 | Blair | H04B 1/26 455/266 |
| 2015/0011912 A1* | 1/2015 | Matsuoka | A61B 7/04 600/586 |
| 2016/0131740 A1* | 5/2016 | Yoo | G01S 7/35 342/70 |

* cited by examiner

METHOD AND DEVICE FOR OPERATING AN ANALOG-TO-DIGITAL CONVERTER FOR CONVERTING A SIGNAL

This application claims priority under 35 U.S.C. § 119 to patent application no. DE 102017210103.2 filed on Jun. 16, 2017 in Germany, the disclosure of which is incorporated herein by reference in its entirety.

The disclosure is based on a device or a method of the type described herein. The subject matter of the disclosure is also a computer program.

BACKGROUND

With the development of wireless sensor nodes and sensors in wearable textiles the demand for electronic circuits with low power consumption has constantly increased. For example, the target for the power consumption for many applications, such as the always switched-on functionality in portable textiles and in integrated Industry 4.0 sensors for intelligent signal processing, is in the range of less than one microwatt.

A first step for a digital signal processing of sensor signals is the analog-to-digital conversion by executing a sampling and quantification process, which is performed by an analog-to-digital converter (ADC). According to the Nyquist criterion the clock frequency of the analog-to-digital converter (i.e., the sampling rate) should be at least twice as large as the optimum or highest frequency in the analog signal, to enable a reconstruction of the signal to be performed without loss of information. However, this can lead to oversampling in times in which these maximum frequencies are not present in the signal to be sampled. Since the power consumption of the analog-to-digital converter is directly related to the sampling rate, this kind of oversampling leads to unnecessary power consumption.

SUMMARY

Against this background, in the approach presented here, a method and also a device which uses this method, and finally, a corresponding computer program in accordance with the disclosure. The measures disclosed herein enable advantageous extensions and improvements to the device specified in the disclosure.

With the approach presented here a method for operating an analog-to-digital converter for converting a signal is presented, wherein the method has the following steps:

calculation of a signal parameter in a spectral sub-range of the signal to be converted, wherein the spectral sub-range comprises a frequency range of the possible sampling frequency range of the analog-to-digital converter, which does not comprise frequencies of at least one other sub-range of the sampling frequency range; and determination of a sampling frequency of the analog-to-digital converter by using the signal parameter and operation of the analog-to-digital converter using the determined sampling frequency.

A signal in the present case can be understood to be an analog signal. A signal parameter can be understood to mean a value or parameter, which represents or models a characteristic variable of the signal or area of the signal. A spectral sub-range of a signal can be understood to mean a partial spectrum or frequency range of the (analog) signal (to be converted). Specifically, the sub-range can comprise a contiguous frequency range of the signal, in which frequencies or signal components from another sub-range or frequency range of the sampling frequency range of the analog-to-digital converter are not included. Thus, the sub-range and the additional sub-range differ in at least one frequency section or frequency range. A sampling frequency range can be understood to mean a frequency range that can be sampled by the analog-to-digital converter. Specifically, an (analog) signal, which has frequencies in the sampling frequency range, can be reconstructed after the analog-to-digital conversion without loss of information.

The approach proposed here is based on the recognition that a signal which is to be analog-to-m digitally converted can be first examined for frequency components which actually occur in the signal, and then an analog-to-digital converter is operated with a sampling frequency which is determined as a function of the frequency components present in the signal. To this end, a signal parameter such as an energy can be calculated in a spectral sub-range of the signal, wherein this signal parameter then enables an inference, for example, as to whether signal components of the signal are present in the spectral sub-range, and therefore in sampling the signal for error-free reconstruction of the signal the analog-to-digital converter used is to be operated with a sampling frequency corresponding to this sub-range. In this way, where appropriate, the advantage can be achieved of avoiding unnecessarily high sampling frequencies in the analog-to-digital conversion of the signal, as a result of which on the one hand, energy for the operation of the analog-to-digital converter can be saved and on the other, the production of an unnecessarily large amount of data in the conversion of the signal can be avoided, which in turn would require an increased computational effort along with increased energy consumption during the subsequent digital processing.

An additional favorable feature is an embodiment of the approach proposed here, in which in the calculation step as the signal parameter an energy of the signal in the spectral sub-range is calculated as a signal parameter, in particular wherein the calculation step is executed using a rectifier and/or a low-pass filter. Such an embodiment of the approach proposed here has the advantage that an energy value as a signal parameter is technically simple and fast to calculate while yet allowing a precise indication as to signal components that occur in the signal in the relevant spectral sub-range or frequency sub-range.

In another advantageous embodiment of the approach proposed here, in the determination step a frequency of the sub-range is determined as the sampling frequency, in particular wherein a cutoff frequency of the sub-range, in particular a maximum frequency of the sub-range, is determined as the sampling frequency. Such an embodiment offers the advantage of a simple and accurate determination of the frequency components occurring in the signal, so that when selecting or setting the (spectral) sub-range to be examined, the sampling frequency, with which the actual analog-to-digital converter is to be operated can be determined directly therefrom.

In another advantageous embodiment of the approach proposed here, in the determination step the sampling frequency is determined in dependence on a comparison of the signal parameter, or a value derived from it, with a threshold value, in particular wherein a frequency of the sub-range is determined as the sampling frequency if the signal parameter or the value derived from it is greater than the threshold value. Such an embodiment of this approach offers a technically very simple implementation option for making an adjustment to the sampling frequency to be used for the operation of the analog-to-digital converter, in particular in the case of very rapidly changing signals or frequency components present in the signal.

A particularly advantageous embodiment of the approach presented here allows very precise utilization of the quantization capabilities of the analog-to-digital converter. In particular, a length of a digital word (for example, a number of bits of the analog-to-digital converter output value) which is output by an analog-to-digital converter can be used to specify the threshold value, so that the analog-to-digital converter only needs to convert signals with the (highest) frequency components, which can also be represented by the digital word output by the analog-to-digital converter. This can be effected in accordance with an embodiment of the approach proposed here by the fact that in the determination step, a threshold value is used which depends on a quantization parameter of the analog-to-digital converter.

In an embodiment of the approach proposed here which is technically very simple to implement, in the calculation step the signal parameter is calculated using a band-pass filter and/or a controllable high-pass filter, in particular to calculate the signal parameter in the spectral sub-range.

In order to be able to examine different sub-ranges of the spectrum of a signal for the presence of signal components in this sub-range, in accordance with another embodiment of the approach proposed here the steps of calculation and determination are executed repeatedly, wherein in the repeatedly executed calculation step an additional signal parameter is calculated in the additional spectral sub-range of the signal to be converted, and wherein in the determination step the sampling rate of the analog-to-digital converter is determined using the additional signal parameter and the analog-to-digital converter is operated using the determined sampling rate. Specifically, the signal can be examined in a plurality of such sub-ranges, so that a spectral resolution of the signal components present in the signal becomes possible and as a result, the sampling rate can be determined precisely and accurately, to avoid as much energy consumption and/or computational effort for the subsequent data processing as possible.

In a particularly advantageous embodiment of the approach proposed here, in the repeatedly executed calculation step an additional signal parameter in the additional spectral sub-range is detected, which has a center frequency which corresponds to half a center frequency of the spectral sub-range within a tolerance band. Such an embodiment of the approach proposed here has the advantage that, by means of the specified use of spectral sub-ranges which are characterized by center frequencies modified by a factor of two, it becomes technically very simple to implement the formation of sub-ranges in which the existence of corresponding signal components of the signal is examined.

In order to be able to react to signals or frequency components present in the signal that change over time by adjustment of the sampling frequency, according to a favorable embodiment of the approach presented here, the steps of calculation and determination can be executed repeatedly in succession, in particular wherein the steps of calculation and determination are repeated cyclically.

An analog-to-digital converter that can be operated in a particularly rapidly and flexibly adjustable way is used in an embodiment of the approach proposed here, in which in the determination step a frequency synthesizer and/or a frequency divider is used in order to determine the sampling frequency and to operate the analog-to-digital converter with a sampling frequency determined in such a way.

The alternative designs of a method presented here can be implemented, for example, in software or hardware or in a combination of software and hardware, for example, in a control unit.

The approach presented here also creates a device that is designed to carry out, to activate and/or implement the steps of an alternative design of a method presented here in corresponding devices. Using this design variant of the disclosure in the form of a device, it is also possible to achieve the underlying object of the disclosure quickly and efficiently.

For this purpose, the device can comprise at least one computation unit for processing signals or data, at least one storage unit for storing signals or data, at least one interface to a sensor or an actuator for reading in sensor signals from the sensor or for outputting data or control signals to the actuator, and/or at least one communication interface for reading in or outputting data that is embedded in a communication protocol. The processing unit can be, for example, a signal processor, a micro-controller or the like, wherein the storage unit can be a flash memory, an EEPROM or a magnetic storage unit. The communication interface can be designed to read in or output data by wireless and/or cable-based means, wherein a communication interface which can read in or output cable-based data can read in this data, for example, by electrical or optical means from an appropriate data transmission line or can output said data into an appropriate data transmission line.

A device can be understood in the present case to mean an electrical device, which processes sensor signals and outputs control and/or data signals depending on them. The device can have an interface, which can be implemented in hardware and/or software. In the case of a hardware-based design, the interfaces can be, for example, part of a so-called system-ASIC, which includes the widest possible range of functions of the device. It is also possible, however, for the interfaces to be dedicated integrated circuits, or at least in part consist of discrete components. In the case of a software-based design, the interfaces can be software modules which exist, for example, on a micro-controller in addition to other software modules.

Also advantageous is a computer program product or computer program with program code, which can be stored on a machine-readable medium or storage medium, such as a semiconductor memory, a hard drive or an optical storage device and is used to carry out, implement and/or control the steps of the method according to any one of the embodiments described above, in particular when the program product or program is executed on a computer or a device.

BRIEF DESCRIPTION OF THE DRAWINGS

Exemplary embodiments of the approach presented here are shown in the drawings and explained in more detail in the following description. Shown are.

DETAILED DESCRIPTION

Figure 1:
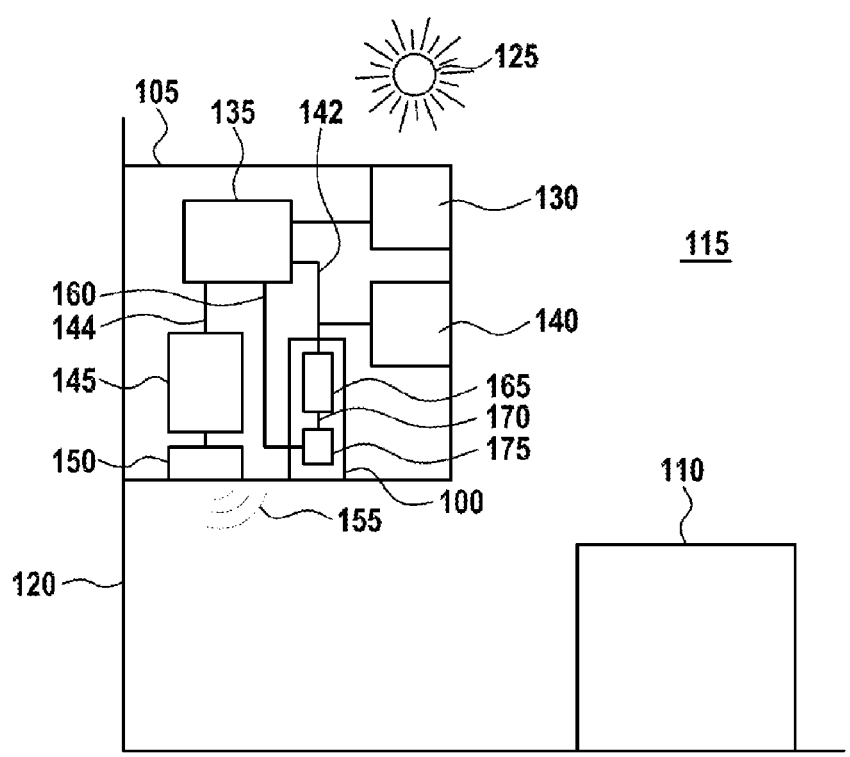
FIG. 1 is a schematic representation of the use of a device for operating an analog-to-digital converter in accordance with an exemplary embodiment of the approach presented here.

In the following description of advantageous exemplary embodiments of the disclosure, identical or similar reference numerals are used for elements shown in the various figures which have similar functions, wherein no repeated description of these elements is given.

FIG. 1 shows a schematic representation of the use of a device 100 for operating an analog-to-digital converter in accordance with an exemplary embodiment of the approach presented here. The device 100 can, for example, be part of a sensor node 105, which is designed to autonomously monitor the operation of a machine 110 in a room 115. For this purpose, the sensor node 105 can be mounted, for example, on a ceiling or wall 120 and supplied with electrical energy, for example from a renewable energy source such as the sun 125. For this purpose, the sensor node 105 comprises, for example, a solar cell 130, which provides electrical energy for the operation of an analog-to-digital converter 135. With the analog-to-digital converter 135 it is then possible, for example, for an analog signal 142 provided by a sensor 140, such as a microphone for recording operating noise of the machine 110, to be analog-to-digitally converted so that this signal 144, which then exists in digital form, can be further processed or analyzed, for example in a digital signal processor 145, for example to be able to output a warning signal 155 via an appropriate interface 150 relating, for example, to a malfunction of the machine 110.

In order to avoid subjecting the analog-to-digital converter 135 to an unnecessarily high energy consumption, in the present case the device 100 for operating the analog-to-digital converter 135 is provided in accordance with an exemplary embodiment, to be able to perform a determination and/or adjustment of a sampling frequency 160 used for the operation of the analog-to-digital converter 135 to a currently existing signal 142. For this purpose, the device 100 comprises a unit 165 for calculating a signal parameter 170, for example the energy, in a spectral sub-range or frequency range of the signal 142 to be converted, which represents a portion of the total sampling frequency range to be acquired by the analog-to-digital converter 135. On the basis of this signal parameter 170, in a determination unit 175 the sampling frequency 160 (currently to be used for the operation of the analog-to-digital converter 135) is determined and fed to the analog-to-digital converter 135, which then samples the signal 142 at the determined sampling frequency 160 in order to obtain the digital signal 144.

Through the use of the device 100, it is now possible to examine the analog signal 142 in such a way that an occurrence of signal components with frequencies in the frequency range and/or the spectral sub-range can be detected, so that it is now possible to operate the analog-to-digital converter 135 at high sampling frequencies, which as noted result in a high energy consumption of the analog-to-digital converter 135 and a high data rate generated by the analog-to-digital converter 135, only if the (analog) signal 132 contains signal components with correspondingly high frequencies. If this is not the case, the analog-to-digital converter can also be operated with a lower sampling frequency 160, which means that the energy consumption of the analog-to-digital converter 135 can then be reduced and a lower data rate at the output of the digital signal 144 should be expected, which in turn leads to a lower energy consumption by the digital signal processor 145 when processing the digital signal 144.

In the approach proposed here and presented in exemplary form, audio signals 142 are used as application examples. The sampling rate of most audio recorders is 44,100 Hertz, which covers frequencies up to 22,050 Hertz in the audio signal 142 to be sampled that can be reconstructed without errors. However, in audio applications (for example in the area of machine condition monitoring by using an audio analysis as digital signal processing) this maximum frequency of 44,100 Hertz can only be achieved for short periods or in the event of irregularities in the operating condition of the machine 110. For this reason, an adaptive sampling of the audio signal 142 can achieve a significant reduction of the current sampling rate or sampling frequency.

The approach presented here can therefore be used, for example, as part of an implementation of an adaptive analog-to-digital converter sampling, in order to reduce both the energy consumption of the analog-to-digital converter 135 or digital signal processor 1405 and the quantity of data to be processed. The goal of the approach presented here can be viewed as the adaptation of the sampling rate of an analog-to-digital converter 135, for example during its operation, on the basis of the signal parameter 170, for example an energy within a specific frequency band, or ideally taking account of signal parameters 170, such as energies in different frequency bands.

The reduction of an analog-to-digital converter sampling rate leads to a direct reduction of the energy consumption of the analog-to-digital converter 135 as well as in a lower computational load and energy consumption of the downstream hardware 145 for digital signal processing.

FIG. 2 shows a block diagram for elucidating each of two different implementations of the adaptive sampling of an analog-to-digital converter 135.

Figure 2A:
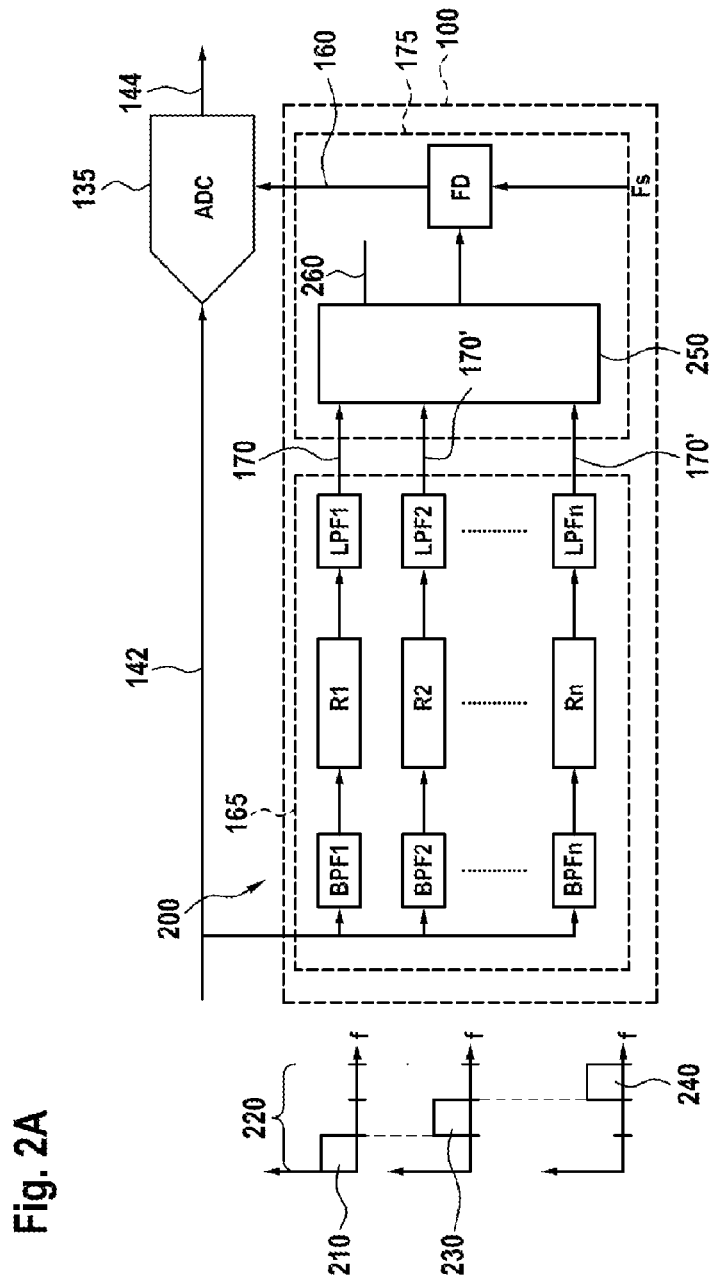
FIG. 2A is a block circuit diagram of a first implementation or first exemplary embodiment of a device for operating an analog-to-digital converter.

The first implementation or first exemplary embodiment of a device 100, shown in a block diagram in FIG. 2A, is based on an implementation of the calculation unit 165 using a filter bank 200 with n band-pass filters BPF1, BPF2, . . . , BPFn and a determination unit 175 based on a frequency divider FD. The bandpass filters BPF1 to BPFn are configured in such a way that each band-pass filter BPF1 to BPFn allows one spectral component of the (analog) signal 142 to pass, which is provided for example by the sensor 140 from FIG. 1, as shown in the illustration of the diagrams on the left of the filter bank 200 formed by the band-pass filters BOF1 to BPFn. In these diagrams, the filter attenuation or frequency response is plotted schematically on the ordinate against the frequency on the abscissa, where it is apparent that each of the bandpass filters BOF1 to BOFn allows signal components to pass with frequencies from a (spectral) sub-range 210 of the sampling frequency range 220 of the analog-to-digital converter 135, while this band-pass filter suppresses signal components from other (spectral) sub-ranges 230, 240 of the sampling frequency range 220. The sampling frequency 220 of the analog-to-digital converter 135 here can be understood to mean the dynamic range, or that frequency range which ranges from 0 Hz up to the maximum possible sampling rate with which the signal 142 can be sampled and still be reconstructed without errors. This maximum sampling frequency, under consideration of the Nyquist Criterion, usually corresponds to twice the maximum frequency of signal components occurring in the signal. In addition, it is apparent that the (spectral) sub-ranges 210, 230, 240 either do not overlap or only very slightly overlap so that, for example, signal components in the signal at a frequency which lies in the sub-range 210 are allowed to pass by the first band-pass filter BPF1, whereas these signal components are blocked by the other band-pass filters BPF2 to BPFn. In this way, a precise analysis of frequencies of signal components of the signal 142 that occur in the signal 142 can be calculated.

In the exemplary embodiment shown in FIG. 2A, after each band-pass filter BOF1, BOF2, ..., BPFn a rectifier R1, R2, ..., Rn followed by a low-pass filter LPF1, LPF2, ..., LPFn is connected in series. This combination of rectifier and low-pass filter after each of the band-pass filters BPF enables the calculation of an energy as a relevant signal parameter 170 in each of the (spectral) sub-ranges 210, 230, or 240. Each of these signal parameters 170 is then fed to the calculation unit 175, which is designed to perform, for example in a comparator 250, a comparison of the relevant signal parameters 170 in the sub-ranges 210 with a threshold value 260, and if the signal parameter 170 exceeds this threshold value 260, for example if the energy represented by the signal parameter 170 is greater than a minimum energy represented by the threshold 260 in the relevant frequency range or sub-range 210, 230 or 240, then a sampling frequency 160 is determined with which the analog-to-digital converter 135 is operated. This sampling frequency 160 can be provided by a frequency divider FD, for example, which is controlled by the comparator 250.

The signal 142 in accordance with the exemplary embodiment shown in FIG. 2A is passed through a number of band-pass filters (BPF) and peak detectors (rectifiers and low-pass filters). This allows the energy in each frequency band 210, 230, 240 of the input signal 142 to be calculated as a signal parameter 170. For the sake of simplicity the band-pass filters BPF can be selected so that the center frequencies are integer divisible by the maximum frequency Fs,max of the sampling frequency Fs, for example FS,max/2, Fs,max/4, Fs,max/8, ..., Fs,max/n. A control unit (for example, as part of the comparator 250) begins with an examination of the energy of the signal components of the signal 142 in the lowest frequency band (Fs,max/8 to Fs,max/4). If the frequencies of the signal components in this frequency band only make small contributions to the total signal energy contained in the signal 142 (for example below the full scale amplitude/2^bits of the analog-to-digital conversion 135, in order to avoid aliasing effects), then the sampling frequency 160 can be obtained by halving the maximum sampling frequency Fs,max using the frequency divider FD. This procedure can be repeated for the following frequency bands or sub-ranges 230, 210 until the highest frequency band with substantial frequencies is reached. The control unit, which is included in the comparator 250 for example, should continue the examination of energies in the skipped frequency bands 210, 230 or 240, so that newly occurring high frequencies are not ignored or overlooked.

Figure 2B:
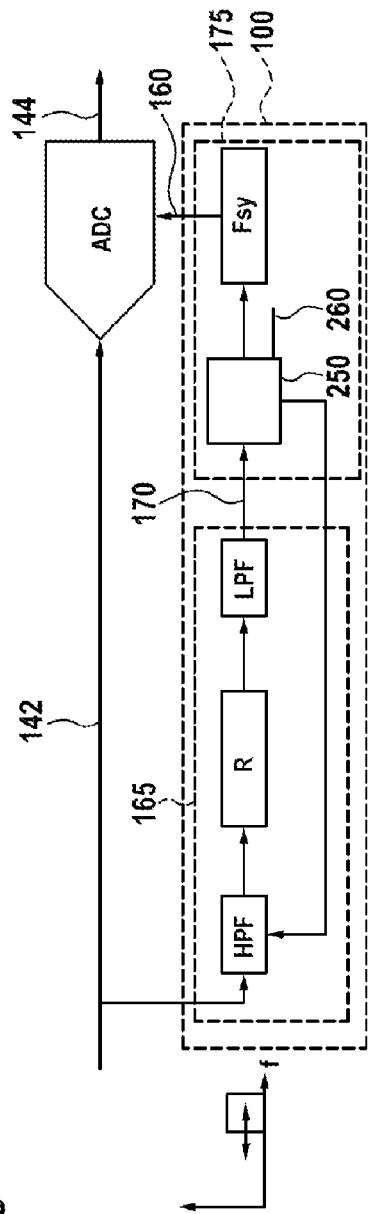
FIG. 2B is a block circuit diagram of a second implementation or second exemplary embodiment of a device for operating an analog-to-digital converter.

In the embodiment shown in FIG. 2B, instead of a filter bank 200 with band-pass filters BPF, only one filter branch is provided. In this filter branch however, instead of the band-pass filter BPF, a controllable high-pass filter HPF is arranged in series with a rectifier R and a low-pass filter LPF. The second implementation of the adaptive sampling shown in FIG. 2B is based on the monitoring of the energy as an example of a signal parameter 160 of a high-pass filter HPF electrically controlled by the comparator 250 and of a frequency synthesizer Fsy as part of the determination unit 175. The frequency of this high-pass filter HPF is adjusted, for example, so that the transmitted frequencies are much less significant than the frequencies which are filtered out by the high-pass filter HPF. This is repeated iteratively by the examination of the energy as signal parameter 160 in the transmitted band as a sub-range and by the electronic re-adjustment of the cutoff frequency of the filter HPF, so that the transmitted energy is, for example, below a detection threshold used as a threshold value in the comparator 260 of the analog-to-digital converter 132 (i.e., below the full scale amplitude/2^bits of the analog-to-digital converter, in order to avoid aliasing effects). Finally, the frequency synthesizer Fsy generates the sampling frequency 2*Fmax.

The advantages to be identified of the approach proposed here are the reduction of the sampling frequency, which additionally results in a direct reduction of the energy consumption of the analog-to-digital converter 135 as well as a reduction of the computational load of the downstream signal processing steps, and a reduction of the energy consumption in the hardware 145 used for signal processing (DSP, microcontroller, etc).

The architecture presented here can be used for application, for example, in integrated sensor nodes for Industry 4.0 applications, in which the consumption of small amounts of energy is very critical. For example, the proposed approach can be used in the monitoring of machines by means of autonomous sensor nodes. Autonomous techniques place high demands on the execution of steps with low energy consumption. Intact machines do not vibrate at high frequencies. The occurrence of signals in audible frequencies can indicate a mechanical malfunction.

Figure 3:
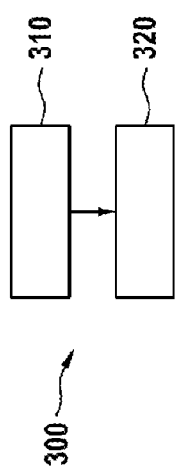
FIG. 3 is a flow chart of a method in accordance with an exemplary embodiment.

FIG. 3 shows a flow chart of a method 300 for operating an analog-to-digital converter for converting a signal, wherein the method comprises a step 310 of calculating a signal parameter in a spectral sub-range of the signal to be converted, wherein the spectral sub-range comprises a frequency range of the potential sampling frequency range of the analog-to-digital converter, but which does not comprise frequencies of at least one other sub-range of the sampling frequency range. The method 300 also comprises a step 320 of determining a sampling frequency of the analog-to-digital converter by using the signal parameter and operating the analog-to-digital converter using the determined sampling frequency.

If an exemplary embodiment comprises an "and/or" association between a first and a second feature, this should be read as meaning that the exemplary embodiment according to one embodiment has both the first feature and the second feature and in accordance with another exemplary embodiment, it has either only the first or only the second feature.

What is claimed is:

1. A method for operating an analog-to-digital converter to convert a signal, comprising:
    calculating a signal parameter in a spectral sub-range of the signal to be converted, wherein the spectral sub-range corresponds to a subset of frequencies in a potential sampling frequency range of the analog-to-digital converter, the potential sampling frequency range being those frequencies that are reconstructable without loss of information after analog-to-digital conversion by the analog-to-digital converter when operated at a maximum sampling frequency of the analog-to-digital converter;
    setting a sampling frequency of the analog-to-digital converter based on the signal parameter; and
    operating the analog-to-digital converter to convert the signal with the set using the determined sampling frequency.

2. The method according to claim 1, the calculating further comprising:

calculating an energy of the signal to be converted in the spectral sub-range as the signal parameter.

3. The method according to claim 1, the setting further comprising:
setting the sampling frequency based on a frequency of the spectral sub-range.

4. The method according to claim 1, the setting further comprising:
setting the sampling frequency based on a comparison of the signal parameter or a value derived therefrom with a threshold value.

5. The method according to claim 4, wherein the threshold value depends on a quantization parameter of the analog-to-digital converter.

6. The method according to claim 1, the calculating further comprising:
calculating the signal parameter using at least one of a band-pass filter and a controllable high-pass filter.

7. The method according to claim 1, wherein:
the calculating the signal parameter and the setting the sampling frequency are executed repeatedly,
the repeatedly executed calculating includes calculating an additional signal parameter in at least one other spectral sub-range of the signal to be converted, and
the setting the sampling frequency includes setting the sampling frequency of the analog-to-digital converter based on the additional signal parameter.

8. The method according to claim 7, the repeatedly executed calculating of the additional signal parameter further comprising:
calculating the additional signal parameter in the at least one other sub-range, which has a center frequency, which corresponds to half a center frequency of the spectral sub-range within a tolerance band.

9. The method according to claim 1, wherein the calculating the signal parameter and the setting the sampling frequency are executed repeatedly in succession.

10. The method according to claim 1, the setting further comprising:
setting the sampling rate using at least one of a frequency synthesizer and a frequency divider.

11. A device comprising:
an analog-to-digital converter; and
a microcontroller configured to:
calculate a signal parameter in a spectral sub-range of a signal to be converted, wherein the spectral sub-range corresponds to a subset of frequencies in a potential sampling frequency range of the analog-to-digital converter, the potential sampling frequency range being those frequencies that are reconstructable without loss of information after analog-to-digital conversion by the analog-to-digital converter when operated at a maximum sampling frequency of the analog-to-digital converter;
set a sampling frequency of the analog-to-digital converter based on the signal parameter; and
operate the analog-to-digital converter to convert the signal with the set sampling frequency.

12. The method according to claim 1, wherein a computer program is configured to at least one of execute and control the method.

13. The method according to claim 12, wherein the computer program is stored in a machine-readable storage medium.

14. The method according to claim 2, the calculating further comprising:
calculating the signal parameter using at least one of a rectifier and a low-pass filter.

15. The method according to claim 3, the setting further comprising:
setting the sampling frequency based on a cutoff frequency of the spectral sub-range.

16. The method according to claim 15, the setting further comprising:
setting the sampling frequency based on a maximum frequency of the spectral sub-range.

17. The method according to claim 4, the setting further comprising:
setting the sampling frequency based on a frequency of the spectral sub-range if the signal parameter or the value derived therefrom is greater than the threshold value.

18. The method according to claim 6, wherein the calculation of the signal parameter the calculating further comprising:
calculating the signal parameter in the spectral sub-range using at least one of the band-pass filter and the controllable high-pass filter.

19. The method according to claim 9, wherein the calculating the signal parameter and the setting the sampling frequency are repeated cyclically.

* * * * *

UNITED STATES PATENT AND TRADEMARK OFFICE
CERTIFICATE OF CORRECTION

PATENT NO. : 10,432,206 B2
APPLICATION NO. : 16/007132
DATED : October 1, 2019
INVENTOR(S) : Ahmad Mansour and Stefan Leidich Page 1 of 1

It is certified that error appears in the above-identified patent and that said Letters Patent is hereby corrected as shown below:

In the Claims

In Claim 1, at Column 8, Line 64, delete the phrase "using the determined" between the words "set" and "sampling".

Signed and Sealed this
Twenty-eighth Day of January, 2020

Andrei Iancu
*Director of the United States Patent and Trademark Office*